US010109620B1

(12) United States Patent
Koe

(10) Patent No.: US 10,109,620 B1
(45) Date of Patent: Oct. 23, 2018

(54) METHOD FOR REDUCING SWITCH ON STATE RESISTANCE OF SWITCHED-CAPACITOR CHARGE PUMP USING SELF-GENERATED SWITCHING BACK-GATE BIAS VOLTAGE

(71) Applicant: GLOBALFOUNDRIES Inc., Grand Cayman (KY)

(72) Inventor: Wern Ming Koe, Irving, TX (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/660,577

(22) Filed: Jul. 26, 2017

(51) Int. Cl.
*H01L 27/02* (2006.01)
*H01L 27/12* (2006.01)

(52) U.S. Cl.
CPC ...... *H01L 27/0222* (2013.01); *H01L 27/1203* (2013.01)

(58) Field of Classification Search
CPC .............................. H01L 27/0222; H02M 3/07
See application file for complete search history.

(56) References Cited

U.S. PATENT DOCUMENTS

| | | | | |
|---|---|---|---|---|
| 5,081,371 | A | 1/1992 | Wong | |
| 6,429,723 | B1 * | 8/2002 | Hastings | H01L 27/0222 327/536 |
| 7,098,725 | B2 * | 8/2006 | Lee | H02M 3/073 327/536 |
| 8,659,347 | B2 * | 2/2014 | Bas | G05F 1/10 327/536 |

OTHER PUBLICATIONS

Chen et al. "0.18—V Input Charge Pump with Forward Body Biasing in Startup Circuit using 65nm CMOS", Published in Custom Integrated Circuits Conference (CICC), 2010 IEEE, Sep. 19-22, 2010, retrieved on Jul. 26, 2017 from "http://ieeexplore.ieee.org/document/5617444/", 4 pages.
Ker et al., "Design of Charge Pump Circuit With Consideration of Gate-Oxide Reliability in Low-Voltage CMOS Processes", Published in IEEE Journal of Solid-State Circuits ( vol. 41, Issue: 5, May 2006 ), retrieved on Jul. 26, 2017 from " http://ieeexplore.ieee.org/document/1624399/", 8 pages.

* cited by examiner

*Primary Examiner* — Hai L Nguyen
(74) *Attorney, Agent, or Firm* — Ditthavong & Steiner, P.C.

(57) ABSTRACT

Switched-capacitor charge pump implemented in FDSOI process technology and a method of forming them are provided. Embodiments include providing a FDSOI substrate; providing a plurality of stages of a first and a second pair of an NFET and PFET over the FDSOI substrate coupled between an input terminal and an output terminal, the first and second pair of each stage being opposite each other; providing a plurality of a first and a second capacitor over the FDSOI substrate, each first and second capacitor connected to a first and a second pair of NFET and PFET of a stage, respectively; connecting a back-gate of a NFET and a back-gate of a PFET of each pair; connecting the connected NFET and PFET back-gates to a front-gate of the pair; and connecting a source of each pair to a front gate of an opposite pair within the stage.

20 Claims, 5 Drawing Sheets

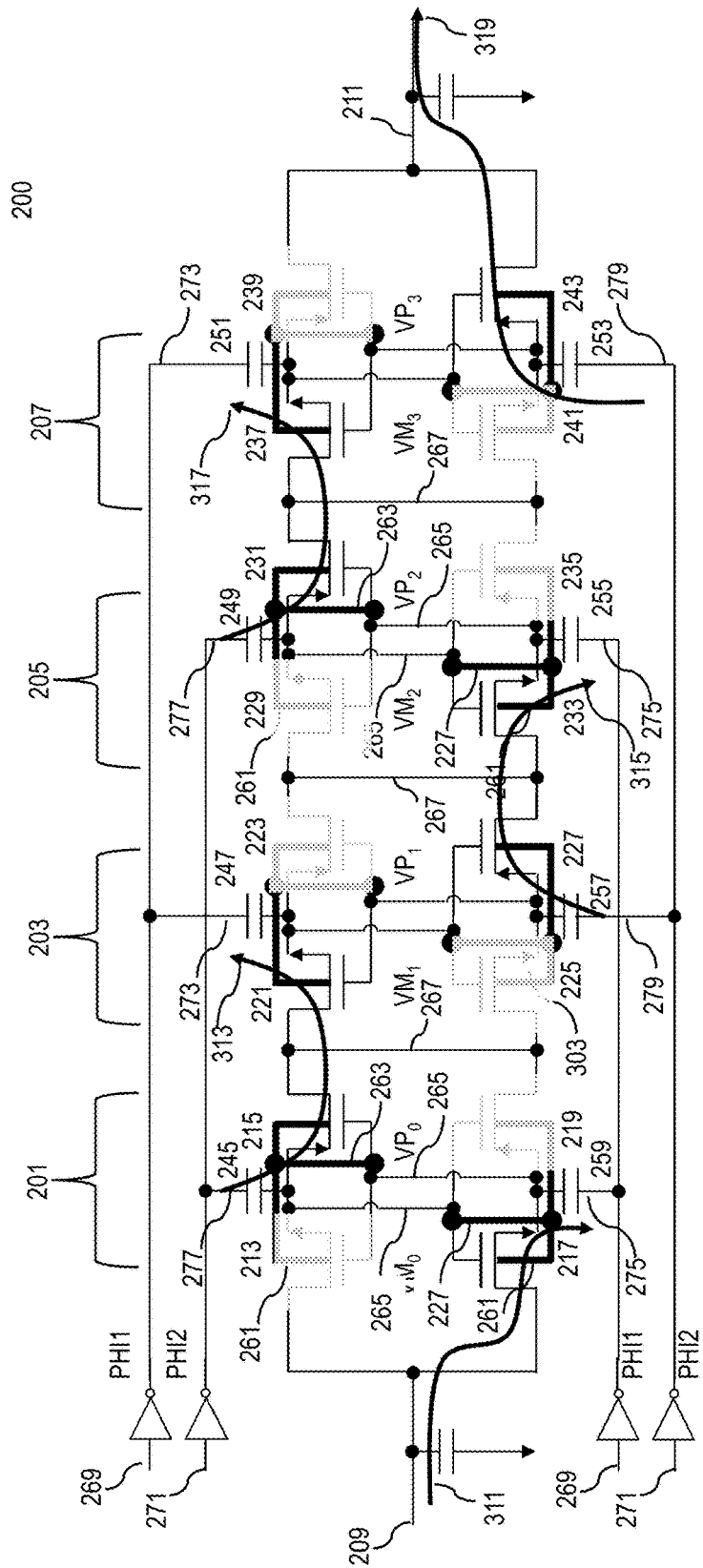
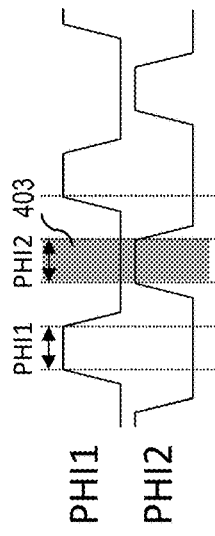
FIG. 3B
FIG. 4B

METHOD FOR REDUCING SWITCH ON STATE RESISTANCE OF SWITCHED-CAPACITOR CHARGE PUMP USING SELF-GENERATED SWITCHING BACK-GATE BIAS VOLTAGE

TECHNICAL FIELD

The present disclosure relates to a voltage conversion circuit, and more particularly to switched-capacitor charge pump with improved power efficiency and output voltage.

BACKGROUND

A charge pump voltage generator is an important circuit for numerous systems and applications for its ability to increase voltage beyond the voltage received from an external power supply. One of the important application is to boost the performance and/or reduce the power of circuits using back-gate bias. However, to generate back-gate bias beyond the supply and ground voltages, a highly efficient charge pump is required so that its power and area overhead does not offset the advantage of the performance boost and power savings.

A conventional charge pump voltage generator circuit design implemented in a bulk complementary metal oxide semiconductor (CMOS) process, wherein the bulk (or back-gate) of a transistor switch is grounded is shown in FIG. 1A. Adverting to FIG. 1A, a switch capacitor charge pump 100 includes a plurality of stages, e.g., four stages 101, 103, 105 and 107. Each of these four stages includes a top half and a bottom half. The top half and the bottom half of each stage includes an n-type field-effect transistor (NFET), a p-type field-effect transistor (PFET) and a capacitor. The back-gate of each NFET (e.g., 109, 113, 117, 121, 125, 129, 133 and 137) is grounded as depicted by the arrow symbol, and the back-gate of each PFET (e.g., 111, 115, 119, 123, 127, 131, 135 and 139) is connected to the drain of each PFET as depicted by the right angle connection. Therefore, the threshold voltage and the "on" state resistance of the transistor switch is higher due to the back-gate effect, especially for switches in the stages that operate at higher generated voltages. This results in higher equivalent resistance, lower output voltage, and lower efficiency when sourcing current. Moreover, the threshold voltage of each transistor switch increases as the source to bulk voltage of each transistor switch increases from one stage to the next stage in a multi-stage charge pump.

A conventional charge pump voltage generator circuit design implemented in isolated well process technology, wherein the isolated well (or back-gate) of transistor switch can be connected to the source is shown in FIG. 1B. Referring to FIG. 1B, the switch capacitor charge pump 140 like the switch capacitor charge pump 100 of FIG. 1A also includes a plurality of stages, e.g., four stages 141, 143, 145 and 147. Each of these four stages includes a top half and a bottom half. The top half and the bottom half of each stage includes an NFET, a PFET and a capacitor. The back-gate of each NFET and PFET (e.g., 149 through 179) is connected to the source of each NFET and PFET, respectively, as depicted by the right angle connection. While the source voltage provides the back-gate bias to reduce the threshold voltage during the "on" state, it is not dynamically switched to a lower voltage during "off" state, hence, the design of FIG. 1B does not provide the other benefit of having higher "off" state resistance and lower leakage. Moreover, the isolated well (or back-gate) can only be connected to the source terminal to avoid the unintended forward biased of the well-diffusion junction diode.

A need therefore exists for methodology enabling the back-gates of a transistor switch of a charge pump voltage generator implemented in an isolated well process technology to be biased with the same voltage generated for the front-gate of each switch.

SUMMARY

An aspect of the present disclosure is a switched-capacitor charge pump implemented in fully depleted silicon-on-insulator (FDSOI) process technology having the back-gates of an NFET and a PFET of each transistor switch connected to the front-gate of the transistor switch.

Another aspect of the present disclosure is a method of biasing the back-gate of a charge pump voltage generator transistor switch with the same voltage generated for the front-gate voltage of the transistor switch using FDSOI process technology.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a device including: a FDSOI substrate; a plurality of stages of a first and a second pair of an NFET and PFET over the FDSOI substrate coupled between an input terminal and an output terminal, the first and second pair of each stage being opposite each other; and a plurality of a first and a second capacitor over the FDSOI substrate, each first and second capacitor connected to a first and a second pair of NFET and PFET of a stage, respectively, wherein a back-gate of a NFET and a back-gate of a PFET of each pair are connected to each other and to a front-gate of the pair and a source of each pair is connected to a front gate of an opposite pair within the stage.

Aspects of the device include a switched-capacitor charge pump. Further aspects include the plurality of stages including four stages. Another aspect includes a first switching clock (PHI1) and a second switching clock (PHI2), wherein the PHI1 is connected to a first capacitor of even stages of the plurality and to a second capacitor of odd stages of the plurality, and the PHI2 is connected to a first capacitor of odd stages of the plurality and to a second capacitor of even stages of the plurality. Further aspects include each first and second capacitor includes a first and a second terminal, and wherein the first terminal of each first capacitor of odd stages is connected to the PHI2 and the first terminal of each first capacitor of even stages is connected to the PHI1; the first terminal of each second capacitor of odd stages is connected to the PHI1 and the first terminal of each second capacitor of even stages is connected to PHI2; and the second terminal of each first and second capacitor is connected to a source terminal of a first or second pair of NFET and PFET of a stage, respectively. Additional aspects include the PHI1 and PHI2 including supply voltage ($V_{DD}$) and ground, respectively, or vice-versa. Other aspects include the back-gate of the NFET including an isolated p-type well (p-well) and the back-gate of the PFET including an n-type well (n-well) or vice-versa. Further aspects include a drain of a PFET of the first pair and a drain of a PFET of the second pair of a stage are connected to a drain of a NFET of the first pair and a drain of a NFET of the second pair of a subsequent coupled stage, respectively. Additional aspects include the input terminal is connected to a drain of a NFET of the first pair and a drain of a NFET of the second pair of an initial stage of the plurality and the output terminal is connected to a drain of a PFET of the first pair and a drain of a PFET of the second pair of a last stage of the plurality.

Another aspect of the present disclosure is a method including: providing a FDSOI substrate; providing a plurality of stages of a first and a second pair of a NFET and PFET over the FDSOI substrate coupled between an input terminal and an output terminal, the first and second pair of each stage being opposite each other; providing a plurality of a first and a second capacitor over the FDSOI substrate, each first and second capacitor connected to a first and a second pair of NFET and PFET of a stage, respectively; connecting a back-gate of a NFET and a back-gate of a PFET of each pair; connecting the connected NFET and PFET back-gates to a front-gate of the pair; and connecting a source of each pair to a front gate of an opposite pair within the stage.

Aspects of the present disclosure include the plurality of stages including four stages. Further aspects include providing a PHI1 and a PHI2; connecting the PHI1 to a first capacitor of even stages of the plurality and to a second capacitor of odd stages of the plurality; and connecting the PHI2 to a first capacitor of odd stages of the plurality and to a second capacitor of even stages of the plurality. Another aspect includes connecting a first terminal of each first capacitor of odd stages to the PHI2 and a first terminal of each first capacitor of even stages to the PHI1; connecting a first terminal of each second capacitor of odd stages to the PHI1 and a first terminal of each second capacitor of even stages to PHI2; and connecting a second terminal of each first and second capacitor to a source terminal of a first or second pair of NFET and PFET of a stage, respectively. Further aspects include the back-gate of the provided NFET including an isolated p-well and the back-gate of the provided PFET including an n-well or vice-versa. Additional aspects include connecting a drain of a PFET of the first pair and a drain of a PFET of the second pair of a stage to a drain of a NFET of the first pair and a drain of a NFET of the second pair of a subsequent coupled stage, respectively. Other aspects include connecting the input terminal to a drain of a NFET of the first pair and a drain of a NFET of the second pair of an initial stage of the plurality; and connecting the output terminal to a drain of a PFET of the first pair and a drain of a PFET of the second pair of a last stage of the plurality.

A further aspect of the present disclosure is a device including: a FDSOI substrate; four stages of a first and a second pair of a NFET and PFET over the FDSOI substrate coupled between an input terminal and an output terminal, the first and second pair of each of the four stages being opposite each other; and a plurality of a first and a second capacitor over the FDSOI substrate, each first and second capacitor connected to a first and a second pair of NFET and PFET, respectively, wherein an isolated p-well back-gate of a NFET and an n-well back-gate of a PFET of each pair are connected to each other and to a front-gate of the pair and a source of each pair is connected to a front gate of an opposite pair within the stage.

Aspects of the present disclosure include the device including a switched-capacitor charge pump. Another aspect includes a PHI1 and a PHI2, wherein the PHI1 is connected to a first capacitor of even stages of the plurality and to a second capacitor of odd stages of the plurality, and the PHI2 is connected to a first capacitor of odd stages of the plurality and to a second capacitor of even stages of the plurality. A further aspect includes each first and second capacitor including a first and a second terminal, and wherein the first terminal of each first capacitor of odd stages is connected to the PHI2 and the first terminal of each first capacitor of even stages is connected to the PHI1; the first terminal of each second capacitor of odd stages is connected to the PHI1 and the first terminal of each second capacitor of even stages is connected to PHI2; and the second terminal of each first and second capacitor is connected to a source terminal of a first or second pair of NFET and PFET of a stage, respectively.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 3A and 3B illustrate alternate switched-back-gate-bias operations of the FDSOI switched-capacitor charge pump of FIG. 2, in accordance with an exemplary embodiment; and FIGS. 4A and 4B are simplified waveform diagrams corresponding to FIGS. 3A and 3B, respectively.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of higher threshold voltage resulting in higher equivalent resistance, lower output voltage and lower efficiency when sourcing current attendant upon connecting back-gates of an NFET and PFET of a transistor switch to their front-gate. The problems are solved, inter alia, by biasing the back-gate of a transistor switch with the same voltage generated for the front-gate voltage using FDSOI process technology (or any independent multi-gate process that does not have a well-diffusion junction diode) to reduce the threshold voltage of transistor switch during the "on" state and increase the threshold voltage switch during the "off" state.

Methodology in accordance with embodiments of the present disclosure includes a FDSOI substrate. A plurality of stages of a first and a second pair of an NFET and PFET over the FDSOI substrate coupled between an input terminal and an output terminal, the first and second pair of each stage being opposite each other. A plurality of a first and a second capacitor over the FDSOI substrate, each first and second capacitor connected to a first and a second pair of NFET and PFET of a stage, respectively. A back-gate of a NFET is connected to a back-gate of a PFET of each pair. The connected NFET and PFET back-gates are connected to a front-gate of the pair and the source of each pair is connected to a front gate of an opposite pair within the stage.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
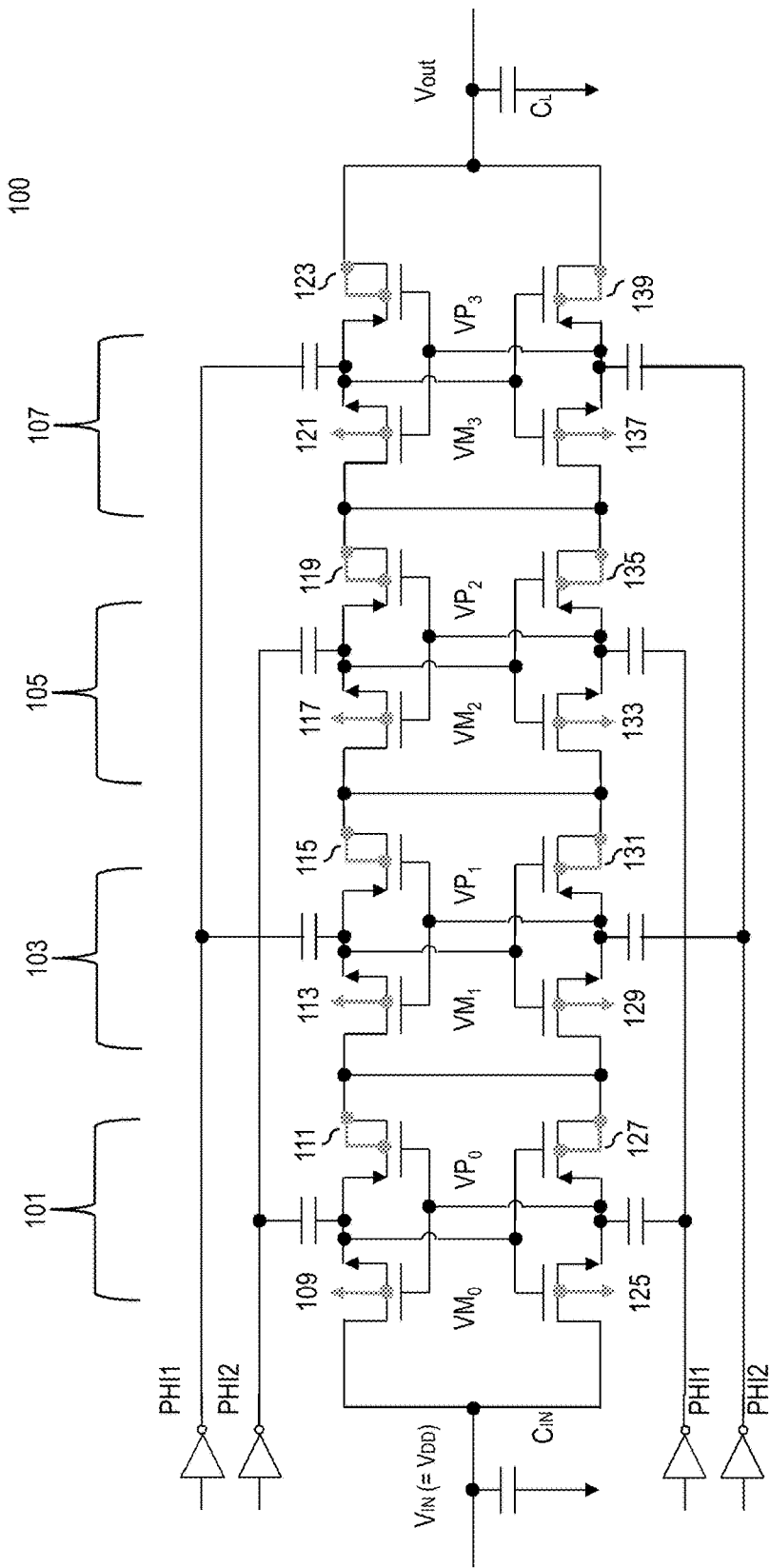
FIG. 1A schematically illustrates a background charge pump voltage generator circuit implemented in a bulk CMOS process.
Figure 1B:
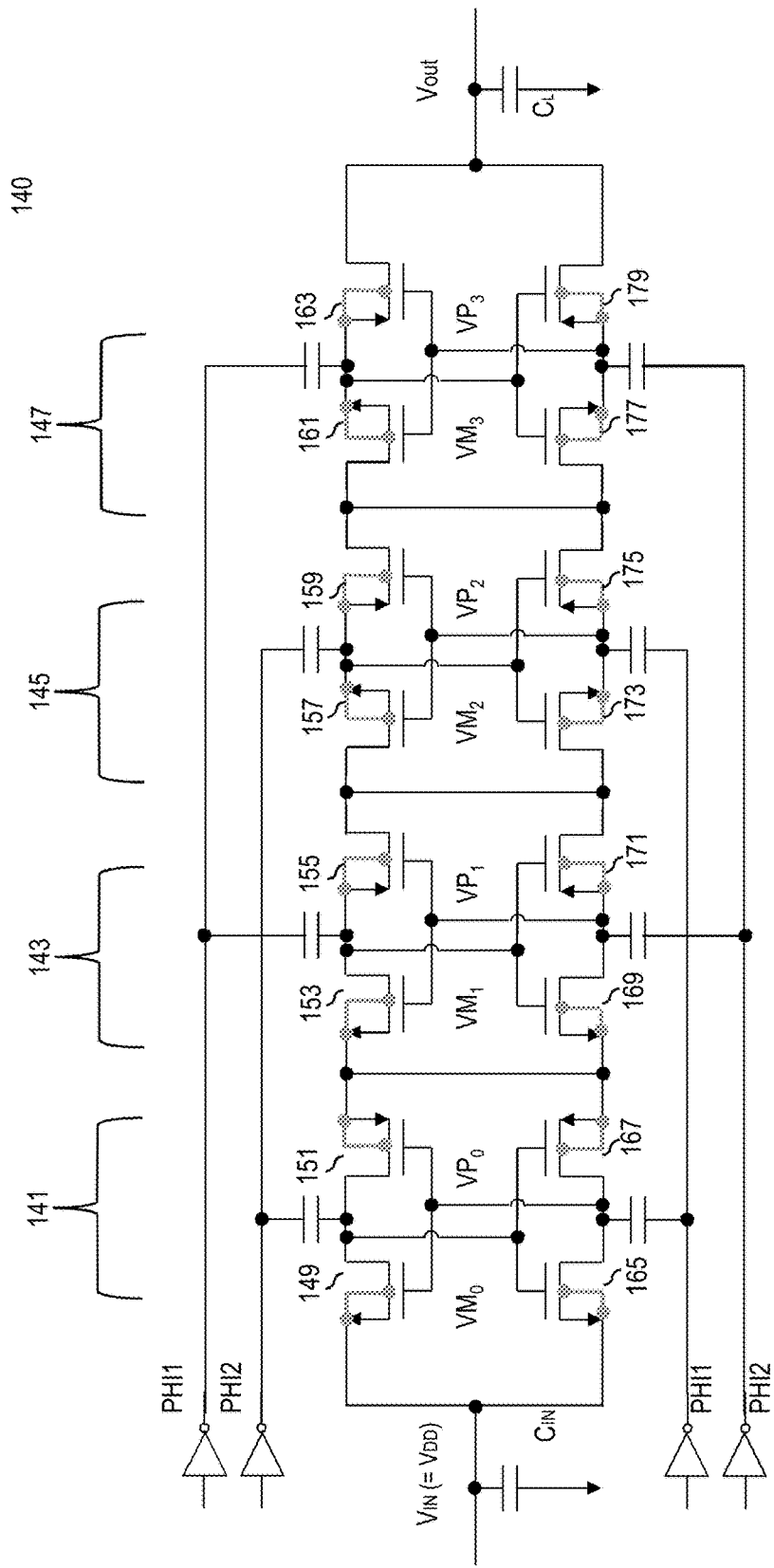
FIG. 1B schematically illustrates a background charge pump voltage generator circuit implemented in an isolated well process.
Figure 2:
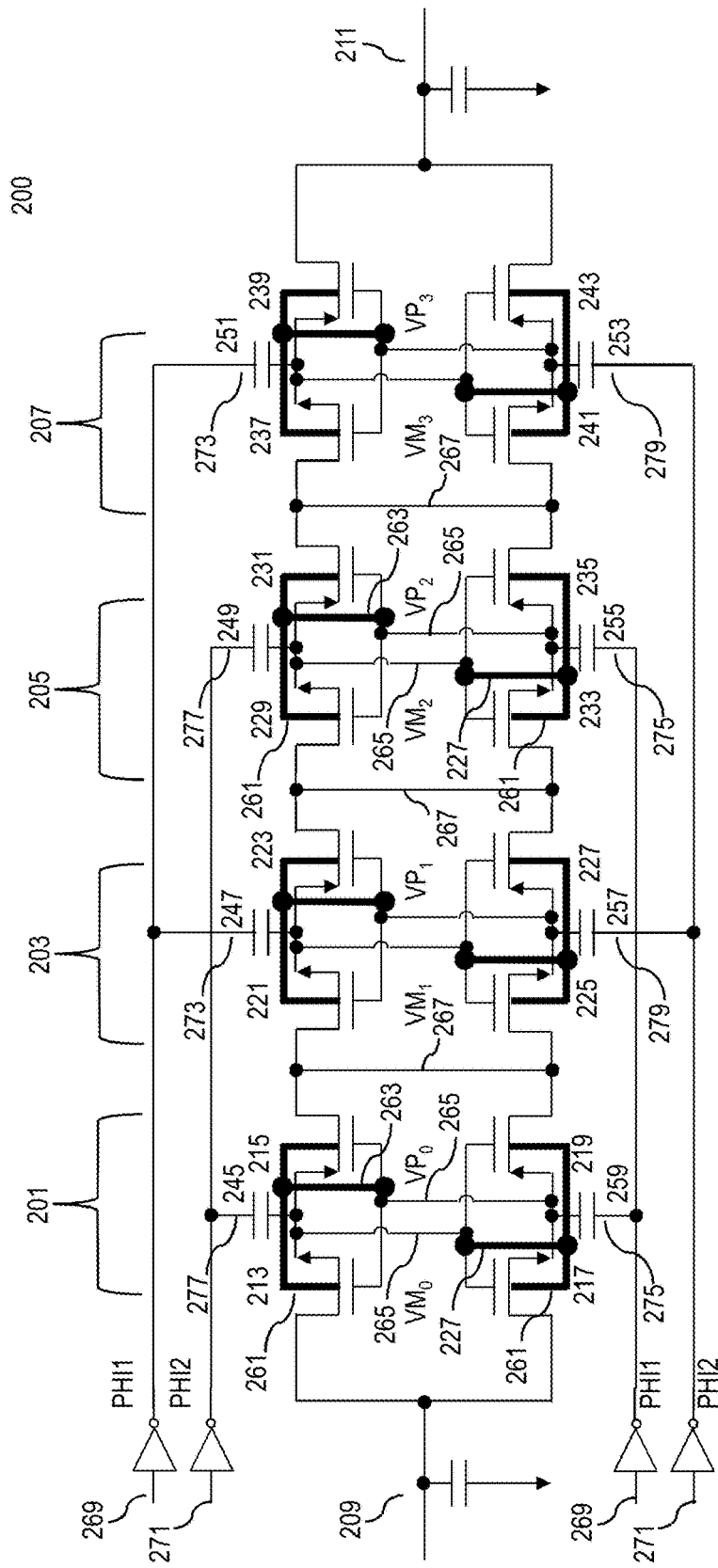
FIG. 2 schematically illustrates a switched-capacitor charge pump implemented in a FDSOI process technology having the back-gates of the NFET and the PFET of each transistor switch connected to the front-gate of the transistor switch, in accordance with an exemplary embodiment.

FIG. 2 schematically illustrates a switched-capacitor charge pump implemented in a FDSOI process technology having the back-gates of the NFET and the PFET of each transistor switch connected to the front-gate of the transistor switch, in accordance with an exemplary embodiment. A switched-capacitor charge pump 200 is implemented in a FDSOI process technology (not shown for illustrative convenience) and includes a plurality of stages, e.g., stages 201, 203, 205 and 207, coupled between an input terminal 209 and an output terminal 211, as depicted in FIG. 2. Each of these four stages includes two pairs of NFET and PFET, e.g., NFET 213 and PFET 215 and NFET 217 and PFET 219; NFET 221 and PFET 223 and NFET 225 and PFET 227; NFET 229 and PFET 231 and NFET 233 and PFET 235; and NFET 237 and PFET 239 and NFET 241 and PFET 243. The back-gate of each NFET may be formed, e.g., of an isolated p-well, and the back-gate of each PFET may be formed, e.g., of an n-well, or vice versa.

A capacitor having two terminals, e.g., capacitors 245 through 259, is connected to each pair of NFET and PFET of each stage, e.g., capacitor 245 and NFET 213 and PFET 215 and capacitor 259 and NFET 217 and PFET 219. The back-gates of each pair of NFET and PFET of each stage, e.g., NFET 213 and PFET 215 and NFET 217 and PFET 219 of stage 201, are connected to each other as depicted by the lines 261 and to the front gate of each pair, as depicted by the lines 263. The source terminal of the NFET and the PFET of each pair, e.g., NFET 213 and PFET 215, are also connected to the front gate of the opposite pair of NFET and PFET of each stage, e.g., NFET 217 and PFET 219 of stage 201, as depicted by the lines 265. In addition, the drain of a PFET of a pair of NFET and PFET, e.g., PFET 215, and the drain of the PFET of the opposite pair of NFET and PFET of the stage, e.g., PFET 219, are connected to each other as well as the drains of the NFETs of the subsequent coupled stage, e.g., NFET 221 and NFET 225 of stage 203, as depicted by the lines 267. Further, the input terminal 209 is connected to each drain of NFET 213 and 217 of the initial stage, e.g., stage 201, and the output terminal 211 is connected to each drain of PFET 239 and 243 of the last stage, e.g., stage 207. In one instance, drain and source describes the terminal of a transistor, nevertheless they are symmetric and the term drain or source can be interminable.

The FDSOI switched-capacitor charge pump 200 of FIG. 2 also includes PHI1 269 and PHI2 271. PHI1 269 is connected to the capacitor of the pair of NFET and PFET of even stages, e.g., capacitors 247 and 251 of stages 203 and 207, respectively, as depicted by the lines 273 and to the capacitor of the pair of NFET and PFET of odd stages, e.g., capacitors 259 and 255 of stages 201 and 205, respectively, as depicted the lines 275. Similarly, PHI2 271 is connected to the capacitor of the pair of NFET and PFET of odd stages, e.g., capacitors 245 and 249 of stages 201 and 205, respectively, as depicted by the lines 277 and the capacitor of the pair of NFET and PFET of even stages, e.g., capacitors 257 and 253 of stages 203 and 207, respectively, as depicted by lines 279. The PHI1 269 and PHI2 271 are $V_{DD}$ and ground, respectively, or vice versa, and are alternating. Consequently, the back-gates of each transistor switch, e.g., NFET 213 and PFET 215, may be biased with the same voltage generated for the front-gate voltage using FDSOI process technology (or any independent multi-gate process that does not have a well-diffusion junction diode).

Figure 3A:
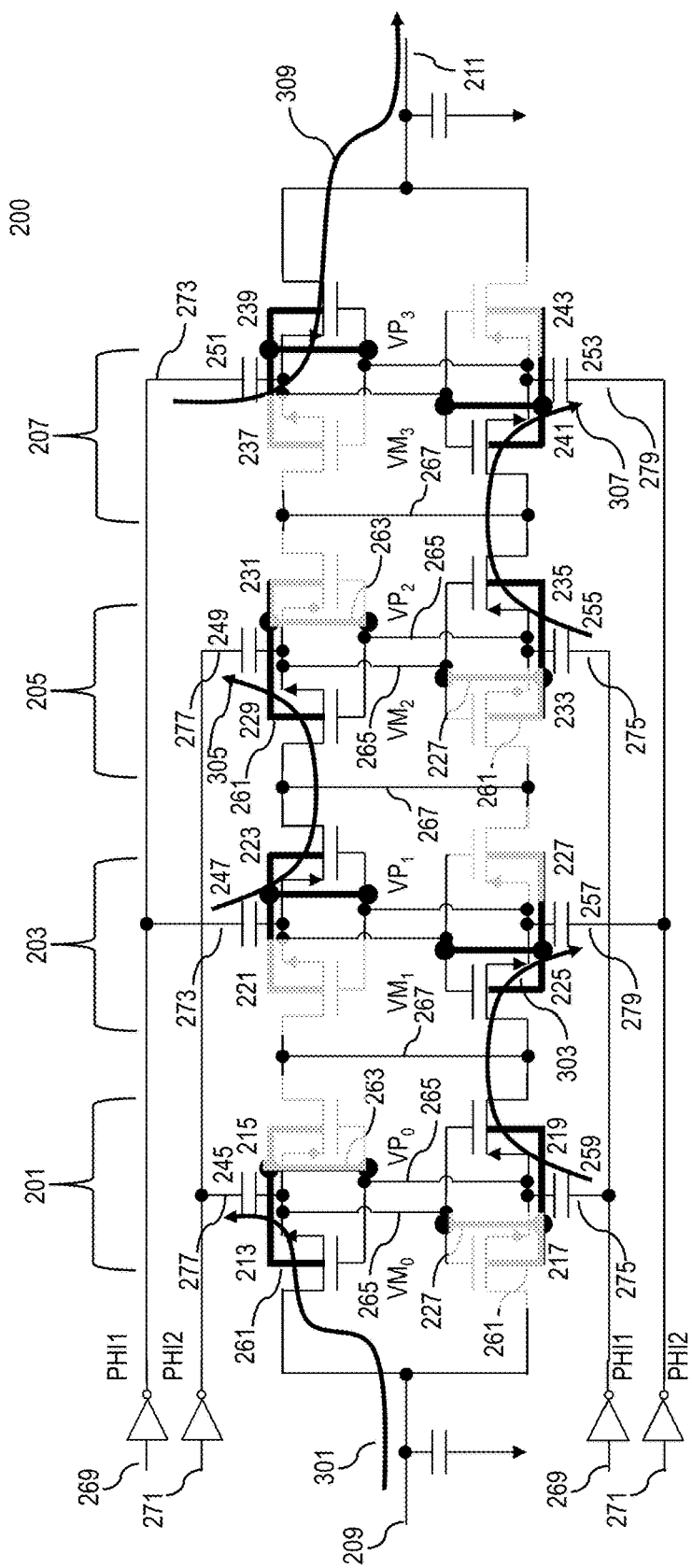
Figure 4A:
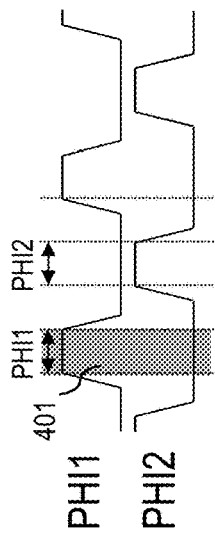

FIGS. 3A and 3B illustrate alternate switched-back-gate-bias operations of the FDSOI switched-capacitor charge pump 200 of FIG. 2, in accordance with an exemplary embodiment, and FIGS. 4A and 4B are simplified waveform diagrams corresponding to FIGS. 3A and 3B, respectively. Adverting to FIG. 3A, when a bias is applied at PHI1 269 of FIG. 2, PHI1 269 is $V_{DD}$ and each of the NFETs connected to PHI1 269, e.g., NFET 217, 221, 233, and 237, is deactivated or in an "off" state and each of the PFETs connected to PHI1 269, e.g., PFET 219, 223, 235 and 239, is activated or in an "on" state. Further, as discussed above, when PHI1 269 is $V_{DD}$ in an "on" state, PHI2 271 is 0 or ground in an "off" state, as highlighted by the shaded region 401 of FIG. 4A. Consequently, each of the NFETs connected to PHI2 271, e.g., NFET 213, 225, 229 and 241, is activated or in an "on" state and each of the PFETs connected to PHI2 271, e.g., PFET 215, 227, 231 and 243, is deactivated or in an "off" state.

Subsequently, when an input voltage ($V_{IN}$) equaling $V_{DD}$ is applied to the input terminal 209 as depicted by the arrow 301, the initial $V_{DD}$ is combined with the $V_{DD}$ applied to PFET 219 from PHI1 269 via the back and front gate connections 263 and the source and front gate connection 265 to generate $2V_{DD}$, which is then transferred to the active NFET 225 of stage 203, as depicted by the arrow 303. Because PFET 227 is deactivated, the $2V_{DD}$ is combined with the $V_{DD}$ applied to PFET 223 from PHI1 269 via the connections 263 and 265 to generate $3V_{DD}$, which is then transferred to the active NFET 229 of stage 205, as depicted by the arrow 305. Following the same pattern, because PFET 231 is deactivated, the 3VDD is combined with the $V_{DD}$ applied to PFET 235 from PHI1 269 via the connections 263 and 265 to generate $4V_{DD}$, which is then transferred to the active NFET 241 of stage 207, as depicted by the arrow 307. Once again, because PFET 243 is deactivated, the $4V_{DD}$ is combined with the $V_{DD}$ applied to PFET 239 from PHI1 269 via the connections 263 and 265 to generate $5V_{DD}$, which is then transferred to the output terminal 211, as depicted by the arrow 309.

FIG. 3B is identical to FIG. 3A, except in this instance, a bias is applied at PHI2 271 of FIG. 2, and, therefore, PHI2 271 is $V_{DD}$ and each of the NFETs connected to PHI2 271, e.g., NFET 213, 225, 229 and 241, is deactivated or in an "off" state and each of the PFETs connected to PHI2 271, e.g., PFET 215, 227, 231 and 243, is activated or in an "on" state. Further, as discussed above, when PHI2 271 is $V_{DD}$ in an "on" state, PHI1 269 is 0 or ground in an "off" state, as highlighted by the shaded region 403 of FIG. 4B. Consequently, each of the NFETs connected to PHI1 269, e.g., NFET 217, 221, 233 and 237, is activated or in an "on" state and each of the PFETs connected to PH11 269, e.g., PFET 219, 223, 235 and 239, is deactivated or in an "off" state.

Subsequently, when $V_{IN}$ equaling $V_{DD}$ is applied to the input terminal 209 as depicted by the arrow 311, the initial $V_{DD}$ is combined with the $V_{DD}$ applied to PFET 215 from PHI2 271 via the back and front gate connections 263 and the source and front gate connection 265 to generate $2V_{DD}$, which is then transferred to the active NFET 221 of stage 203, as depicted by the arrow 313. Again, because PFET 223 is deactivated, the $2V_{DD}$ is combined with the $V_{DD}$ applied to PFET 227 from PHI2 271 via the connections 263 and 265 to generate $3V_{DD}$, which is then transferred to the active NFET 233 of stage 205, as depicted by the arrow 315. Following the same pattern, because PFET 235 is deactivated, the $3V_{DD}$ is combined with the $V_{DD}$ applied to PFET 231 from PHI2 271 via the connections 263 and 265 to generate $4V_{DD}$, which is then transferred to the active NFET 237 of stage 207, as depicted by the arrow 317. Once again, because PFET 239 is deactivated, the $4V_{DD}$ is combined with the $V_{DD}$ applied to PFET 243 from PHI2 271 via the connections 263 and 265 to generate $5V_{DD}$, which is then transferred to the output terminal 211, as depicted by the arrow 319.

The embodiments of the present disclosure can achieve several technical effects including reducing threshold voltage, hence, achieving lower "on" state switch resistance during charging and pumping phase, which results in lower equivalent resistance, higher output voltage and higher efficiency when sourcing current; during the holding phase, the transistor switch returns to its non-back-gate biased threshold voltage, hence, achieving higher "off" state switch resistance, which minimizes current leakage, thereby improving efficiency; for multi-stages charge-pump the threshold voltage of the transistor switch in each stage is identical since all switches have identical voltage difference between the source and bulk $(V_{SB})=V_{DD}$ in the "on" state and $V_{SB}=0$ in the "off" state; and the present disclosure does not require an additional back-gate bias voltage generator circuit that consumes additional power because the back-gate is biased with the self-generated switching front-gate voltage. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of various types of integrated circuit (IC) devices including a charge-pump voltage generator.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
   a fully depleted silicon-on-insulator (FDSOI) substrate;
   a plurality of stages of a first and a second pair of a n-type field-effect transistor (NFET) and p-type field-effect transistor (PFET) over the FDSOI substrate coupled between an input terminal and an output terminal, the first and second pair of each stage being opposite each other; and
   a plurality of a first and a second capacitor over the FDSOI substrate, each first and second capacitor connected to a first and a second pair of NFET and PFET of a stage, respectively,
   wherein a back-gate of a NFET and a back-gate of a PFET of each pair are connected to each other and to a front-gate of the pair and a source of each pair is connected to a front gate of an opposite pair within the stage.

2. The device according to claim 1, wherein the device comprises a switched-capacitor charge pump.

3. The device according to claim 1, wherein the plurality of stages comprises four stages.

4. The device according to claim 3, further comprising a first switching clock (PHI1) and a second switching clock (PHI2),
   wherein the PHI1 is connected to a first capacitor of even stages of the plurality and to a second capacitor of odd stages of the plurality, and the PHI2 is connected to a first capacitor of odd stages of the plurality and to a second capacitor of even stages of the plurality.

5. The device according to claim 4, wherein each first and second capacitor comprises a first and a second terminal, and wherein the first terminal of each first capacitor of odd stages is connected to the PHI2 and the first terminal of each first capacitor of even stages is connected to the PHI1; the first terminal of each second capacitor of odd stages is connected to the PHI1 and the first terminal of each second capacitor of even stages is connected to PHI2; and the second terminal of each first and second capacitor is connected to a source terminal of a first or second pair of NFET and PFET of a stage, respectively.

6. The device according to claim 5, wherein the PHI1 and PHI2 comprise supply voltage ($V_{DD}$) and ground, respectively, or vice-versa.

7. The device according to claim 1, wherein the back-gate of the NFET comprises an isolated p-type well (p-well) and the back-gate of the PFET comprises an n-type well (n-well) or vice-versa.

8. The device according to claim 1, wherein a drain of a PFET of the first pair and a drain of a PFET of the second pair of a stage are connected to a drain of a NFET of the first pair and a drain of a NFET of the second pair of a subsequent coupled stage, respectively.

9. The device of claim 1, wherein the input terminal is connected to a drain of a NFET of the first pair and a drain of a NFET of the second pair of an initial stage of the plurality and the output terminal is connected to a drain of a PFET of the first pair and a drain of a PFET of the second pair of a last stage of the plurality.

10. A method comprising:
    providing a fully depleted silicon-on-insulator (FDSOI) substrate;
    providing a plurality of stages of a first and a second pair of a n-type field-effect transistor (NFET) and p-type field-effect transistor (PFET) over the FDSOI substrate coupled between an input terminal and an output terminal, the first and second pair of each stage being opposite each other;

providing a plurality of a first and a second capacitor over the FDSOI substrate, each first and second capacitor connected to a first and a second pair of NFET and PFET of a stage, respectively;

connecting a back-gate of a NFET and a back-gate of a PFET of each pair;

connecting the connected NFET and PFET back-gates to a front-gate of the pair; and connecting a source of each pair to a front gate of an opposite pair within the stage.

11. The method according to claim 10, wherein the plurality of stages comprises four stages.

12. The method according to claim 10, further comprising:

providing a first switching clock (PHI1) and a second switching clock (PHI2);

connecting the PHI1 to a first capacitor of even stages of the plurality and to a second capacitor of odd stages of the plurality; and connecting the PHI2 to a first capacitor of odd stages of the plurality and to a second capacitor of even stages of the plurality.

13. The method according to claim 12, comprising:

connecting a first terminal of each first capacitor of odd stages to the PHI2 and a first terminal of each first capacitor of even stages to the PHI1;

connecting a first terminal of each second capacitor of odd stages to the PHI1 and a first terminal of each second capacitor of even stages to PHI2; and connecting a second terminal of each first and second capacitor to a source terminal of a first or second pair of NFET and PFET of a stage, respectively.

14. The method according to claim 10, wherein the back-gate of the provided NFET comprises an isolated p-type well (p-well) and the back-gate of the provided PFET comprises an n-type well (n-well) or vice-versa.

15. The method according to claim 10, comprising connecting a drain of a PFET of the first pair and a drain of a PFET of the second pair of a stage to a drain of a NFET of the first pair and a drain of a NFET of the second pair of a subsequent coupled stage, respectively.

16. A method according to claim 10, comprising:

connecting the input terminal to a drain of a NFET of the first pair and a drain of a NFET of the second pair of an initial stage of the plurality; and connecting the output terminal to a drain of a PFET of the first pair and a drain of a PFET of the second pair of a last stage of the plurality.

17. A device comprising:

a fully depleted silicon-on-insulator (FDSOI) substrate;

four stages of a first and a second pair of a n-type field-effect transistor (NFET) and p-type field-effect transistor (PFET) over the FDSOI substrate coupled between an input terminal and an output terminal, the first and second pair of each of the four stages being opposite each other; and a plurality of a first and a second capacitor over the FDSOI substrate, each first and second capacitor connected to a first and a second pair of NFET and PFET, respectively, wherein an isolated p-type well (p-well) back-gate of a NFET and an n-type well (n-well) back-gate of a PFET of each pair are connected to each other and to a front-gate of the pair and a source of each pair is connected to a front gate of an opposite pair within the stage.

18. The device according to claim 17, wherein the device comprises a switched-capacitor charge pump.

19. The device according to claim 17, further comprising a first switching clock (PHI1) and a second switching clock (PHI2), wherein the PHI1 is connected to a first capacitor of even stages of the plurality and to a second capacitor of odd stages of the plurality, and the PHI2 is connected to a first capacitor of odd stages of the plurality and to a second capacitor of even stages of the plurality.

20. The device according to claim 19, wherein each first and second capacitor comprises a first and a second terminal, and wherein the first terminal of each first capacitor of odd stages is connected to the PHI2 and the first terminal of each first capacitor of even stages is connected to the PHI1; the first terminal of each second capacitor of odd stages is connected to the PHI1 and the first terminal of each second capacitor of even stages is connected to PHI2; and the second terminal of each first and second capacitor is connected to a source terminal of a first or second pair of NFET and PFET of a stage, respectively.

\* \* \* \* \*